US012754253B2

(12) United States Patent
Zhang et al.

(10) Patent No.: US 12,754,253 B2

(45) Date of Patent: Oct. 6, 2026

(54) STRESS-BASED COMPREHENSIVE METHOD AND SYSTEM FOR EVALUATING STATE OF HEALTH OF POWER BATTERY, MEDIUM AND DEVICE

(71) Applicant: SHANDONG UNIVERSITY, Jinan (CN)

(72) Inventors: Chenghui Zhang, Jinan (CN); Miao Yu, Jinan (CN); Yunlong Shang, Jinan (CN); Yuhao Zhu, Jinan (CN)

(73) Assignee: SHANDONG UNIVERSITY, Jinan (CN)

( * ) Notice: Subject to any disclaimer, the term of this patent is extended or adjusted under 35 U.S.C. 154(b) by 389 days.

(21) Appl. No.: 18/400,225

(22) Filed: Dec. 29, 2023

(65) Prior Publication Data

US 2024/0393403 A1 Nov. 28, 2024

(30) Foreign Application Priority Data

May 25, 2023 (CN) ......................... 202310605173.5
May 31, 2023 (CN) ......................... 202310646414.0
May 31, 2023 (CN) ......................... 202310647199.6

(51) Int. Cl.

*G01R 31/392* (2019.01)
*G01R 31/367* (2019.01)
*G01R 31/382* (2019.01)
*G01R 31/389* (2019.01)

(52) U.S. Cl.

CPC ......... *G01R 31/392* (2019.01); *G01R 31/367* (2019.01); *G01R 31/382* (2019.01); *G01R 31/389* (2019.01)

(58) Field of Classification Search

CPC .. G01R 31/392; G01R 31/367; G01R 31/382; G01R 31/389

See application file for complete search history.

(56) References Cited

U.S. PATENT DOCUMENTS 11,094,973 B2 * 8/2021 Fortier .................. H01M 10/48
2008/0231284 A1 * 9/2008 Birke ...................... B60L 58/12 324/426
2013/0271148 A1 * 10/2013 Maeda .................. B60L 3/0046 324/426
2013/0278221 A1 * 10/2013 Maeda .................. B60L 3/0046 320/134

(Continued)

*Primary Examiner* — Keith D Bloomquist

(74) *Attorney, Agent, or Firm* — Oliff PLC

(57) ABSTRACT

A stress-based comprehensive method and system for evaluating state of health of a power battery, medium and device, the method including: acquiring the stress and capacity of a battery charging and discharging cycle; correlating between acquired stress and capacity, calculating the battery charge and health states based on stress; evaluating the battery charge state by correlating the stress and battery charge state; acquiring a current battery capacity and internal resistance and predicting remaining useful battery life to calculate current capacity-based and internal resistance-based states of battery health respectively; and calculating a weighted sum of the battery state of health based on stress, the capacity-based and the internal resistance-based states of battery health, and obtaining a comprehensively evaluated state of battery health by combining the weighted sum and evaluated state of battery charge.

16 Claims, 8 Drawing Sheets

(56) References Cited

U.S. PATENT DOCUMENTS

| | | | | |
|---|---|---|---|---|
| 2014/0107949 | A1* | 4/2014 | Arnold | G01R 31/392 702/42 |
| 2017/0153292 | A1* | 6/2017 | Steiber | G01R 31/3648 |
| 2023/0417838 | A1* | 12/2023 | K.V. | G01R 31/382 |

* cited by examiner

STRESS-BASED COMPREHENSIVE METHOD AND SYSTEM FOR EVALUATING STATE OF HEALTH OF POWER BATTERY, MEDIUM AND DEVICE

TECHNICAL FIELD

The present invention relates to the technical field of evaluation of state of health of batteries, and particularly to a stress-based comprehensive method and system for evaluating state of health of a power battery, a medium and a device.

BACKGROUND

The statements in this section merely provide background information related to the present invention, and do not necessarily constitute the prior art.

Lithium-ion batteries, due to their high energy density, wide working temperature, no pollution, long cycle life and other advantages, are widely used in power vehicles, smart grids, medical devices and other fields. However, the performance of lithium-ion batteries tends to deteriorate gradually with the increase of cycle times, which is also accompanied by potential safety hazards. The performance degradation of lithium-ion batteries results from the combined effect of various degradation mechanisms inside. During the charging-discharging cycle of lithium-ion batteries, lithium ions constantly migrate in the positive and negative electrodes, causing the volume change of electrode materials, and the electrolyte solution will decompose and generate a gas, causing mechanical deformation and performance degradation of the batteries. Accurate and efficient evaluation of the State of Health (SOH) of a battery is of great significance to ensure the safe and reliable operation of the battery.

The State of Charge (SOC) directly reflects the remaining quantity of electricity of the battery, which is an important reference index for the use, management and maintenance of the battery, and can be used to comprehensively evaluate the SOH of the battery. Moreover, the battery performance gradually deteriorates with constant charging and discharging, that is, the remaining useful life (RUL) of the battery gradually decreases till the end of life (EOL). After EOL, the capacity and power of the battery decreases significantly, directly leading to the occurrence of operation obstacles and accidents, such as shutdown and fire, and even causing serious damage to the power system.

There are many electrochemical mechanisms interacting inside the battery during use, which jointly affect the external performance of the battery. During charging, ions are deintercalated from the positive electrode material, migrated through the electrolyte solution and intercalated into the negative electrode. During discharging, the ions migrate opposite to the intercalation direction. In the charging and discharging process, ions are constantly deintercalated and intercalated in the positive and negative electrode materials, causing the volume change of the electrode materials and generation of a gas. This in turn results in stress in the battery.

The internal stress of the battery mainly includes reversible stress and irreversible stress. In a single charging and discharging process, the stress that varies with the increase or decrease of the SOC of the battery is reversible stress. During use, the battery is aging constantly. The stress increasing with the decrease of the SOH of the battery is irreversible stress, that is, the residual stress inside the battery. Large stress variations may lead to mechanical deformation and electrode rupture of the battery, which harm the battery performance and cause safety problems such as short circuit of the battery. Therefore, during the use of the battery, the impact of stress should be fully considered. The increase of internal stress in the battery highly correlates with the decline of the battery capacity, and the charging and discharging capacity of the battery will gradually deteriorate with the increase of stress, leading to the decline of the battery life.

According to the inventor's insight, the definition and calculation method of SOH for lithium-ion batteries are relatively simple at present. If only the relationship between the internal resistance and the SOH of the battery is considered, the change of internal resistance is not obvious before SOH drops to 80%, and the evaluation accuracy is low. If the SOH of the battery is defined only by considering the battery capacity, the evaluation results tend to be interfered, the error is large, and the accuracy decreases with time. Where the state of health of the battery is defined respectively by using the capacity and the internal resistance and then the SOH is comprehensively evaluated, without considering the influence of internal parameters of the battery, the accuracy and calculation efficiency are low. If multiple features are extracted from the IC curve of the battery and input into a discriminative model to evaluate the SOH of the battery, the calculation process is complicated and inefficient.

SUMMARY

To solve the above problems, the present invention provides a stress-based comprehensive method and system for evaluating state of health of a power battery, a medium and a device. From the inside of the battery, the state of charge of the battery is evaluated by means of the high correlation between the stress and the state of charge of the battery, the influence of the remaining useful life of the battery on the current state of health of the battery is comprehensively considered, the state of health of the battery is redefined, and the state of health of the battery is comprehensively evaluated.

According to some embodiments, a first solution of the present invention provides a stress-based comprehensive method and system for evaluating state of health of a power battery. The following technical solution is adopted.

A stress-based comprehensive method for evaluating state of health of a power battery comprises:

- acquiring the stress and capacity of a charging and discharging cycle of the battery;
- according to the correlation between the acquired stress and capacity, calculating the state of charge of the battery and the state of health of the battery defined based on the stress;
- evaluating the state of charge of the battery by taking the correlation between the stress and state of charge of the battery into account;
- acquiring a current capacity and internal resistance of the battery and predicting a current remaining useful life of the battery;
- according to the acquired current remaining useful life of the battery, calculating a current capacity-based state of health of the battery and internal resistance-based state of health of the battery respectively; and
- calculating a weighted sum of the obtained state of health of the battery defined based on the stress, the capacity-based state of health of the battery and the internal resistance-based state of health of the battery, and obtaining a comprehensively evaluated state of health of the battery by combining the weighted sum with the evaluated state of charge of the battery.

As a further technical definition, a new battery is sampled to acquire the maximum stress, the internal resistance and the discharging capacity of an initial charging and discharging cycle, and the maximum stress and the internal resistance of a corresponding charging and discharging cycle at the end of life of the battery. After acquiring the stress and the capacity of the charging and discharging cycles of the battery, the battery is subjected to a cyclic charging and discharging test to obtain the battery capacity and the maximum stress data of each cycle, and the obtained data is preprocessed.

As a further technical definition, the state of charge of the battery represents a current remaining charge in the battery, that is, the ratio of the remaining quantity of electricity to the rated capacity of the battery at a discharging rate. Considering the linear relationship between the stress and capacity change of the battery in a single charging and discharging cycle, the battery is subjected to a cyclic charging and discharging test and the stress and state-of-charge data of the battery in a single charging and discharging cycle under different state-of-health conditions is recorded respectively, to obtain the stress and state of charge of the battery in the single charging and discharging cycle in different states of health.

As a further technical definition, considering the correlation between the stress and the state of charge of the battery, the state of charge $SOC_\sigma$ of the battery defined based on the stress is:

$$SOC_\sigma = \frac{\sigma_c - \sigma_1(SOH_\sigma)}{\sigma_2(SOH_\sigma) - \sigma_1(SOH_\sigma)} \times 100\%$$

where $\sigma(SOH_\sigma)$ is the battery stress as a function of the state of health, that is, at a $SOH_\sigma$, the battery stress of a state-of-charge is determined; $\sigma_1(SOH_\sigma)$ and $\sigma_2(SOH_\sigma)$ are respectively the corresponding stress of the battery when fully discharged and fully charged at a current $SOH_\sigma$; and $\sigma_C$ is the current stress determined during use.

As a further technical definition, a specific process for evaluating the state of charge of the battery includes:

- obtaining the stress and the state of charge of the battery in a single charging and discharging cycle under different state-of-health conditions;
- analyzing the correlation between the stress and the state of charge of the battery in different health states, to obtain a linear relationship between the state of charge and the stress; and
- according to the obtained linear relationship, evaluating the state of charge of the battery defined based on the stress.

Further, the battery stress is inversely proportional to the state of health of the battery.

Further, the linear relationship between the state of charge and the stress is obtained by calculating the Pearson correlation coefficient between the stress and the state of charge.

As a further technical definition, a specific process for predicting the current remaining useful life of the battery includes:

- evaluating the remaining useful life of the battery by taking the battery capacity, the internal resistance and the battery stress into account comprehensively through a specific process including:
- when the useful capacity of the battery is lower than an initially set value of the capacity, the internal resistance is increased to k times of the initial internal resistance, and the stress is increased to m times of the initial stress, stopping the cyclic charging and discharging test, and recording the battery stress at this time, where k and m are positive numbers;
- analyzing the stress data, and calculating the correlation between the battery stress and the battery life, to obtain the remaining useful life of the battery defined based on the stress;
- calculating the corresponding remaining useful life of the battery based on the capacity and the internal resistance data respectively, and comprehensively evaluating the remaining useful life of the battery by combining the capacity-based remaining useful life of the battery and the internal resistance-based remaining useful life of the battery with the remaining useful life of the battery defined based on the stress.

Further, the remaining useful life $RUL_\sigma$ of the battery defined based on the stress is $$RUL_\sigma = N_{end}^\sigma - N_{use}^\sigma \text{ or } t_{end}^\sigma - t_{use}^\sigma$$
$$\text{s.t. } 1 \le \frac{\sigma_{use}}{\sigma_{ini}} \le M,$$

where $N_{end}^\sigma$ and $t_{end}^\sigma$ are respectively the number of cycles or usage time at the end of life, $N_{use}^\sigma$ and $t_{use}^\sigma$ are respectively the current number of cycles or usage time, $\sigma_{use}$ is the current battery stress, $\sigma_{ini}$ is the initial stress, and M is a constant.

Further, by taking the battery capacity, the internal resistance and the battery stress comprehensively into account, the evaluated remaining useful life $RUL_t$ of the battery is $$RUL_t = a \times RUL_c + b \times RUL_r + c \times RUL_\sigma$$
$$\text{s.t. } a + b + c = 1,$$

where a, b and c are respectively the weight coefficient of the capacity-based remaining useful life of the battery, the weight coefficient of the internal resistance-based remaining useful life of the battery, and the weight coefficient of the battery stress-based remaining useful life of the battery, and can be selected according to different occasions, $RUL_c$ and $RUL_r$ are respectively the capacity-based remaining useful life of the battery and the internal resistance-based remaining useful life of the battery, and $RUL_\sigma$ is the stress-based remaining useful life of the battery.

As a further technical definition, the state of health of the battery is calculated according to the capacity, to obtain the state of health $SOH_{\sigma 1}$ of the battery defined based on the stress, that is, $$SOH_{\sigma 1} = \frac{\frac{1}{\sigma_{now}}}{\frac{1}{\sigma_{new}}} \times 100\%,$$

where $\sigma_{now}$ is the maximum stress of the battery in a current cycle, and $\sigma_{new}$ is the maximum stress of a new battery.

As a further technical definition, the state of health of the battery is calculated according to the internal resistance, to obtain the state of health $SOH_{\sigma 2}$ of the battery defined based on the stress, that is, $$SOH_{\sigma 2} = \frac{\sigma_{end} - \sigma_{now}}{\sigma_{end} - \sigma_{new}} \times 100\%,$$

where $\sigma_{end}$ is the corresponding maximum stress at the end of life of the battery, that is, when the capacity declines to 80% of the initial capacity, $\sigma_{now}$ is the maximum stress of the battery in a current cycle, and $\sigma_{new}$ is the maximum stress of a new battery.

As a further technical definition, the Pearson correlation coefficient between the acquired stress and capacity is calculated to analyze the correlation between the obtained stress and capacity.

As a further technical definition, the states of health of the battery considering different factors and their proportional factors are calculated, and the weighted sum of the obtained different states of health of the battery is calculated according to their proportional factors, to realize the comprehensive evaluation of the state of health of the battery.

According to some embodiments, a second solution of the present invention provides a stress-based comprehensive evaluation system for state of health of a power battery. The following technical solution is adopted.

A stress-based comprehensive evaluation system for state of health of a power battery includes:

- an acquisition module, configured to acquire the stress and capacity of a charging and discharging cycle of the battery;
- a first calculation module, configured to, according to the correlation between the acquired stress and capacity, calculate the state of charge of the battery and the state of health of the battery defined based on the stress;
- a first evaluation module, configured to evaluate the state of charge of the battery by taking the correlation between the stress and the state of charge of the battery into account;
- a prediction module, configured to acquire a current capacity and internal resistance of the battery and predict a current remaining useful life of the battery;
- a second calculation module, configured to, according to the acquired current remaining useful life of the battery, calculate a current capacity-based state of health of the battery and internal resistance-based state of health of the battery respectively; and
- a comprehensive evaluation module, configured to calculate a weighted sum of the obtained state of health of the battery defined based on the stress, the capacity-based state of health of the battery and the internal resistance-based state of health of the battery, to obtain a comprehensively evaluated state of health of the battery.

According to some embodiments, a third solution of the present invention provides a non-transitory computer-readable storage medium. The following technical solution is adopted.

A non-transitory computer-readable storage medium, storing a program thereon, is provided. The program, when executed by a processor, implements the steps of the stress-based comprehensive method for evaluating state of health of a power battery according to the first solution of the present invention.

According to some embodiments, a fourth solution of the present invention provides an electronic device. The following technical solution is adopted.

An electronic device includes a memory, a processor, and a program stored in the memory and executable on the processor. The program, when executed by the processor, implements the steps of the stress-based comprehensive method for evaluating state of health of a power battery according to the first solution of the present invention.

Compared with related art, the present invention has the following beneficial effects.

The determination of the battery stress in the present invention is simple, convenient and rapid, and can accurately reflect the state of health of the battery. By combining various SOHs defined based on the stress, the internal resistance, and the capacity, and using a variety of comprehensive evaluation models, the weights are calculated and adjusted according to the needs in different scenarios, so that the evaluation results are objective and accurate, unlikely to be interfered, and robust. In the comprehensive evaluation method, the definitions based on the stress, the capacity, and the internal resistance are combined, an appropriate multi-parameter evaluation model is used according to the scenario, the proportional factors are calculated, and the weighted sum of the obtained SOHs is calculated, to realize the comprehensive evaluation of the state of health of the battery.

According to the present invention, the battery life evaluation and prediction are comprehensively considered in the process of calculating the current state of health of the battery, to improve the accuracy of comprehensive evaluation for the state of health of the battery.

In the present invention, based on the high correlation between the battery stress and the SOC of the battery, the state of charge of the battery is redefined based on the stress $SOC_{\sigma}$, so as to realize the accurate estimation of the SOC of the battery. According to the high correlation between the battery stress and the SOC, the state of charge of the battery can be reflected accurately in real time. Therefore, the SOC of the battery can be accurately and efficiently evaluated in various SOHs. The evaluation results are unlikely to be interfered, and robust.

BRIEF DESCRIPTION OF THE DRAWINGS

The accompanying drawings consisting a part of the specification are intended to provide further understanding of the present invention and the schematic embodiments and description thereof in the present invention are provided for explaining the present invention, and do not constitute a restriction on the present invention.

DETAILED DESCRIPTION

The present invention will be further described below with reference to the accompanying drawings and specific embodiments.

It should be noted that the following detailed description is exemplary and is intended to provide a further description of the present invention. Unless otherwise indicated, all technical and scientific terms used herein have the same meaning as commonly understood by one of ordinary skill in the art to which the present invention belongs.

It is to be noted that the terminology used herein is for the purpose of describing particular embodiments, and is not intended to limit the exemplary embodiments of the present invention. As used herein, unless otherwise explicitly specified in the context, the use of singular forms also includes plural referents. Moreover, it should also be understood that when the term "comprise" and/or "include" are used in the specification, it means the presence of a feature, a step, an operation, a component, an assembly and/or a combination thereof.

The embodiments and the features in the embodiments in the present invention can be combined with each other without conflict.

Embodiment 1

Embodiment 1 of the present invention describes a stress-based comprehensive method for evaluating state of health of a power battery.

Figure 1:
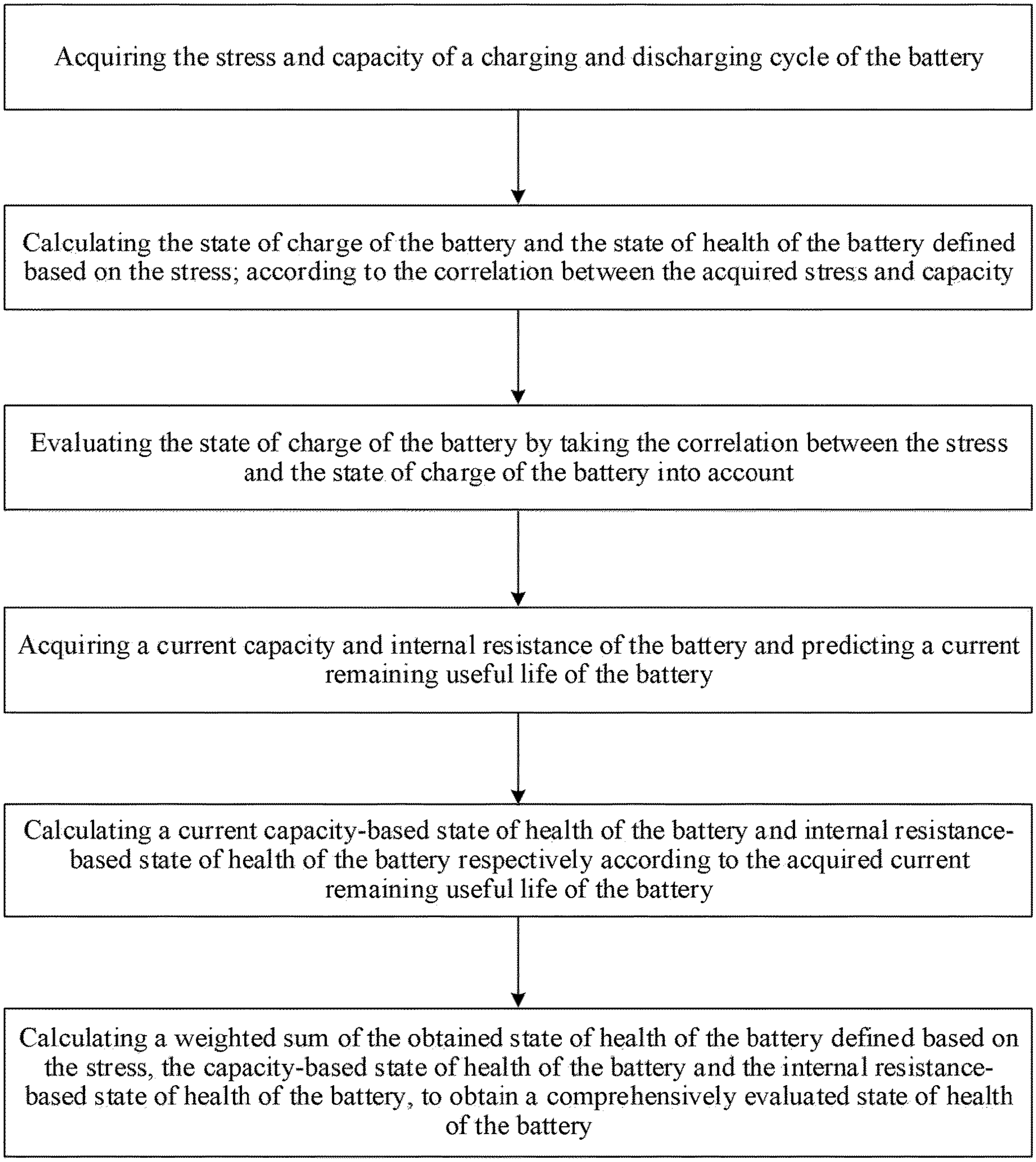
FIG. 1 shows a flow chart of a stress-based comprehensive method and system for evaluating state of health of a power battery provided in Embodiment 1 of the present invention.

As shown in FIG. 1, the stress-based comprehensive method for evaluating state of health of a power battery includes:

- acquiring the stress and capacity of a charging and discharging cycle of the battery;
- according to the correlation between the acquired stress and capacity, calculating the state of charge of the battery and the state of health of the battery defined based on the stress;
- evaluating the state of charge of the battery by taking the correlation between the stress and the state of charge of the battery into account;
- acquiring a current capacity and internal resistance of the battery and predicting a current remaining useful life of the battery;
- according to the acquired current remaining useful life of the battery, calculating a current capacity-based state of health of the battery and internal resistance-based state of health of the battery respectively; and
- calculating a weighted sum of the obtained state of health of the battery defined based on the stress, the capacity-based state of health of the battery and the internal resistance-based state of health of the battery, and obtaining a comprehensively evaluated state of health of the battery by combining the weighted sum with the evaluated state of charge of the battery.

During a cyclic charging and discharging process of the battery, lithium ions in the electrode materials are continuously deintercalated and intercalated, which will lead to irreversible changes in the internal stress of the battery, resulting in mechanical deformation, capacity decline and performance degradation of the battery. Therefore, the change of the battery stress corresponds to the chemical reaction inside the battery, and is closely related to the state of health of the battery. Moreover, the stress measurement is simple and efficient, so it can be used as an important index to define and evaluate the SOH of the battery.

The battery aging is mainly indicated by the decline of the capacity and the increase of the internal resistance. At present, SOH is mainly evaluated by the changes of the capacity and internal resistance of the battery.

The formula for capacity-based definition is:

$$SOH = \frac{C_{now}}{C_{in}} \times 100\% \tag{1}$$

where $C_{now}$ is a current battery capacity; and $C_{in}$ is the rated capacity of the battery.

The formula for internal resistance-based definition is:

$$SOH = \frac{R_{end} - R_{now}}{R_{end} - R_{new}} \times 100\% \tag{2}$$

where $R_{end}$ is the internal resistance at the end of life of the battery, $R_{now}$ is a current internal resistance of the battery, and $R_{new}$ is the internal resistance of a new battery.

The state of health of the battery is affected by many factors in combination. The SOHs of the battery obtained from the internal resistance- and capacity-based definitions reflects the state of health of the battery itself macroscopically. From the inside of the battery, the stress is closely related to various chemical reactions in the battery.

In one or more embodiments, there are obvious stress changes and deformation characteristics during the charging and discharging process of lithium-ion batteries. The changes of battery stress correspond to complex internal reactions and are directly related to the lithium ion content in the electrode materials. Therefore, the battery stress can be used as an important internal parameter to define and evaluate the SOC of batteries.

The SOC of batteries represents the current remaining charges in the battery, that is, the ratio of the remaining quantity of electricity to the rated capacity of the battery at a certain discharging rate. The calculation formula is as follows:

$$SOC = \frac{Q_c}{Q_r} \times 100\% \tag{3}$$

where $Q_c$ is a current remaining quantity of electricity of the battery; and $Q_r$ is the rated capacity of the battery.

From the inside of the battery, the stress is closely related to various chemical reactions in the battery, and can directly reflect the state of charge of the battery.

The process for calculating the state of charge (SOC) of the battery specifically includes the following steps:

(1) subjecting the battery to a cyclic charging and discharging test, and recording the stress and state-of-charge data of the battery in a single charging and discharging cycle under different state-of-health conditions;

(2) preprocessing the data, and analyzing the correlation between the stress data and the SOC data of the battery; and (3) according to the linear relationship between the data, deducing the state of charge $SOC_\sigma$ of the battery defined based on the stress definition.

Based on the high linear relationship between the stress and capacity change of the battery in a single charging and discharging cycle, the formula for defining SOC based on the stress is:

$$SOC_\sigma = \frac{\sigma_C - \sigma_1(SOH_\sigma)}{\sigma_2(SOH_\sigma) - \sigma_1(SOH_\sigma)} \times 100\% \tag{4}$$

where $\sigma(SOH_\sigma)$ is the battery stress as a function of the state of health, that is, at a $SOH_\sigma$, the battery stress of a state-of-charge is determined; $\sigma_1(SOH_\sigma)$ and $\sigma_2(SOH_\sigma)$ are respectively the corresponding stress of the battery when fully discharged and fully charged at a current $SOH_\sigma$; and $\sigma_C$ is the current stress determined during use.

By using Formula (2), the state of charge at different $SOH_\sigma$ can be defined and evaluated, which is highly correlated to the state of charge $SOC_c$ calculated based on the capacity according to Formula (1). The range of $SOC_\sigma$ is from 0% to 100%, which is consistent with the range of $SOC_c$. The result of evaluation by this new definition is accurate and easy to be attained, and unlikely to be interfered.

Figure 2:
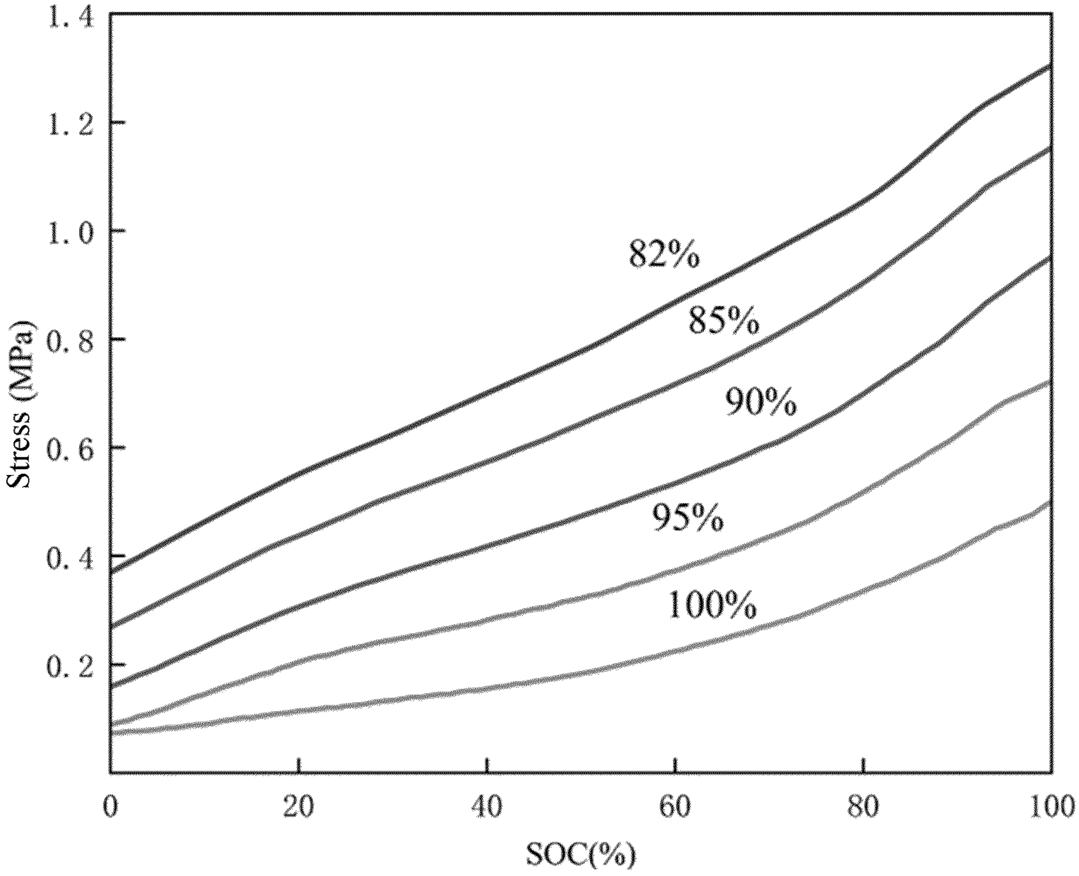
FIG. 2 schematically shows a stress-SOC curve in Embodiment 1 of the present invention.

A cyclic charging and discharging test is performed on a pouch lithium ion battery. The battery is charged once respectively at a state of health of the battery of 100%, 95%, 90%, 85%, 82%, and the data of battery stress varying with SOC is collected. A stress-SOC curve as shown in FIG. 2 is plotted.

The Pearson correlation coefficient is used to calculate the linear relationship between the stress and SOC. The Pearson correlation coefficient $\rho_{XY}$ is calculated by a formula below:

$$\rho_{XY} = \frac{\text{cov}(X, Y)}{\sigma_X \sigma_Y} = \frac{E[(X - \mu_X)(Y - \mu_Y)]}{\sigma_X \sigma_Y} \tag{5}$$

in which cov(X, Y) is the covariance of two variables X, Y.

The Pearson correlation coefficients between the battery stress and SOC in different states of health are calculated as shown in Table 1.

TABLE 1

Pearson correlation coefficients between stress and SOC

| Correlation coefficient | SOH 100% | 95% | 90% | 85% | 82% |
|---|---|---|---|---|---|
| Pearson correlation coefficient | 0.9636 | 0.9826 | 0.9883 | 0.9933 | 0.9960 |

It can be seen from FIG. 2 and Table 1 that in a single charging and discharging process of the battery, the stress increases with the increase of SOC, and shows a high linear relationship. According to the overall upward shift of the stress change curve with the decrease of SOH in FIG. 2, it can be seen that with the aging of the battery, the irreversible stress accumulated in the battery gradually increases, the curve shifts upward generally, and the linear relationship between the stress and SOC gradually increases.

Figure 3:
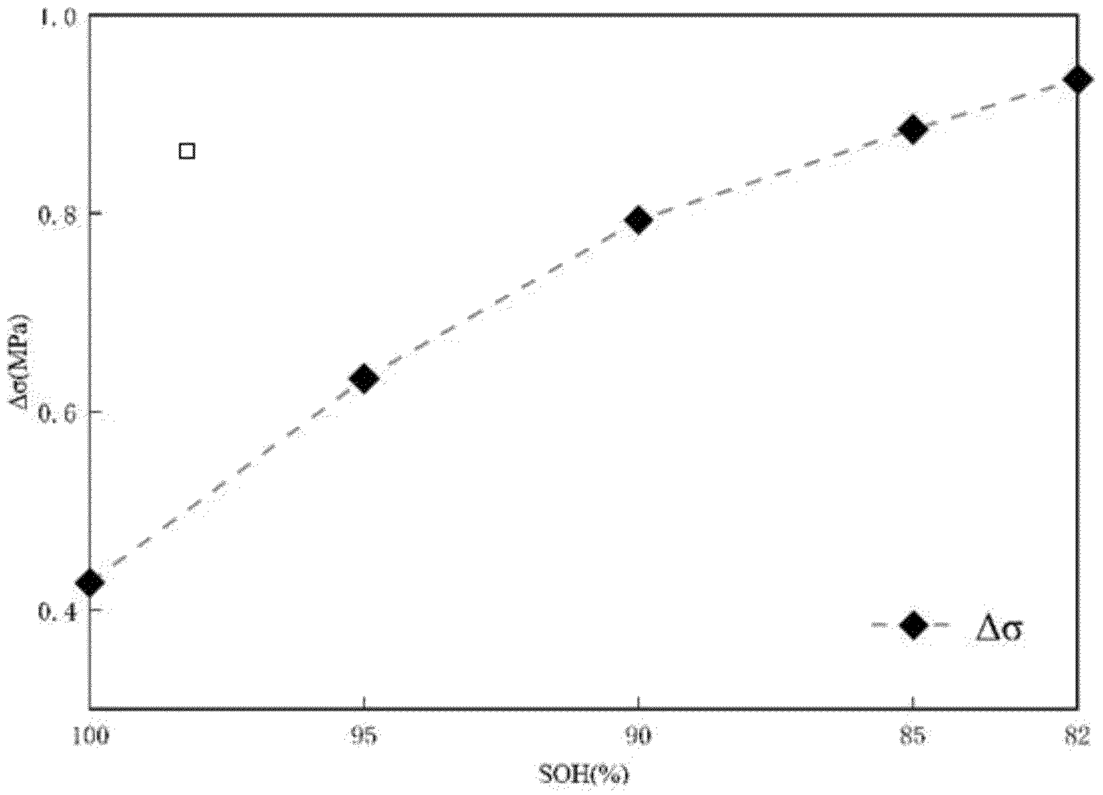
FIG. 3 schematically shows a change curve of $\Delta\sigma$ in Embodiment 1 of the present invention.

The change of the stress difference Δσ (that is, the reverse stress) when the battery is fully discharged and fully charged in different states of health, that is, the changes of the stress generated by the battery itself with SOH during charging, is plotted. Δσ is calculated by a formula shown below, and the change trend is shown in FIG. 3. It can be seen from FIG. 3 that, as the state of health of the battery gradually decreases, the reversible stress Δσ generated in the battery itself during the charging process is increasing.

$$\Delta\sigma = \sigma_{max} - \sigma_{min} \tag{6}$$

where $\sigma_{max}$ and $\sigma_{min}$ are the maximum stress and minimum stress generated during a single charging process of the battery, respectively.

Figure 4:
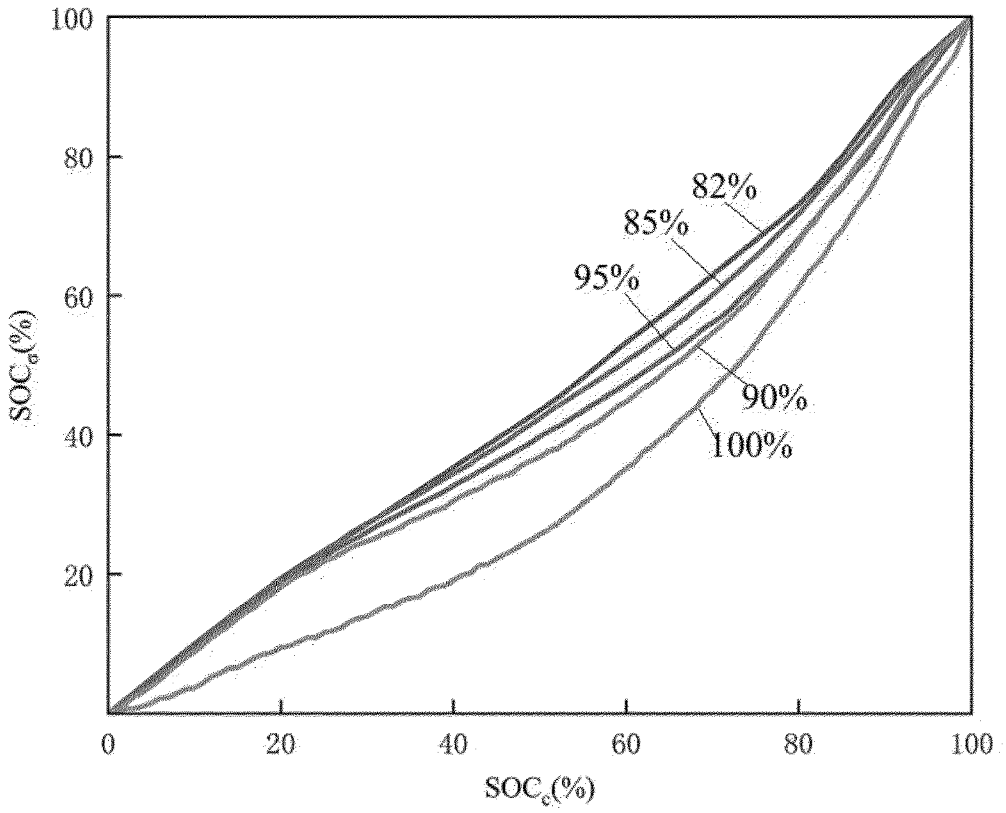
FIG. 4 schematically shows a change curve of $SOC_{\sigma}$-$SOC_c$ in Embodiment 1 of the present invention.

According to the high correlation between the battery stress and SOC in different states of health, Formula (4) can be deduced. $SOC_\sigma$ is calculated with the current stress data and state of health, and compared with the capacity-based $SOC_c$ obtained by Formula (3), A $SOC_\sigma$-$SOC_c$ curve is plotted, as shown in FIG. 4.

Figure 5:
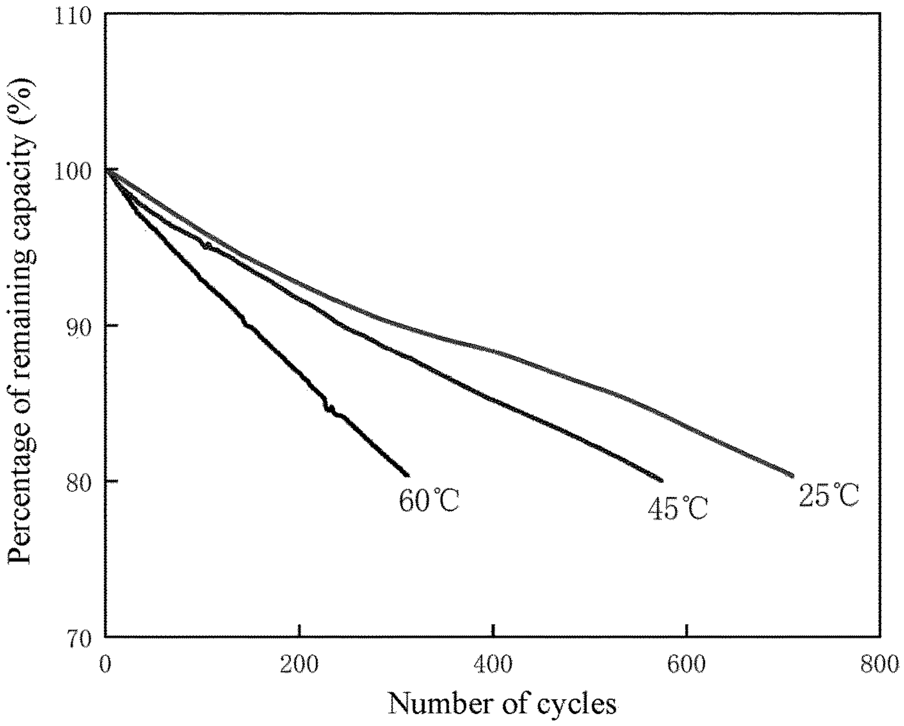
FIG. 5 schematically shows a capacity decline curve in Embodiment 1 of the present invention.

It can be seen from FIG. 5 that, the stress-based $SOC_\sigma$ has a smaller error when $SOC_c$ is less than 20% and greater than 80%, and the linear relationship is higher. The error during the middle charging process gradually increases, and the evaluation accuracy decreases. When $SOC_c$ is 5% and 95%, the relative errors between $SOC_\sigma$ and $SOC_c$ are calculated, and the results are shown in Table 2.

TABLE 2

Relative error (%) between $SOC_\sigma$ and $SOC_c$

| $SOC_c$ | SOH 100% | 95% | 90% | 85% | 82% |
|---|---|---|---|---|---|
| 5% | 0.7061 | 0.2128 | 0.1296 | 0.0303 | 0.0023 |
| 95% | 0.0317 | 0.0112 | 0.0280 | 0.0106 | 0.0044 |

It can be seen from Table 2 that the relative error between $SOC_\sigma$ and $SOC_c$ is small at two ends and the evaluation accuracy is high, so the state of charge of the battery can be accurately reflected. According to Formula (4), the correlation between $SOC_\sigma$-$SOC_c$ is the same as that between stress-$SOC_c$, and $SOC_\sigma$ and $SOC_c$ has a high linear relationship, so the SOC of the battery can be estimated efficiently and accurately by using the stress.

In one or more embodiments, the decline of the battery life is affected by many factors in combination and the RUL defined by the capacity and the internal resistance only reflects the battery life macroscopically. From the inside of the battery, the stress is closely related to various chemical reactions and characteristic changes in the battery. Therefore, in this embodiment, according to the definitions based on the capacity and the internal resistance and the high correlation between the stress and the battery life, the stress-based remaining useful life of the battery $RUL_\sigma$ is:

$$RUL_\sigma = N_{end}^\sigma - N_{use}^\sigma \text{ or } t_{end}^\sigma - t_{use}^\sigma \quad (7)$$
$$\text{s.t. } 1 \le \frac{\sigma_{use}}{\sigma_{ini}} \le M$$

where $$N_{end}^\sigma \text{ and } t_{end}^\sigma$$

are respectively the number of cycles (cycle life) or usage time (calendar life) at the end of life, $$N_{use}^\sigma \text{ and } t_{use}^\sigma$$

are respectively the current number of cycles (cycle life) or usage time (calendar life), $\sigma_{use}$ is the current battery stress, $\sigma_{ini}$ is the initial stress, and M is a constant and $M \in [2.9, 3.2]$.

By combining various RULs defined based on the stress, the capacity, and internal resistance, the weighted sum of various RULs is calculated, to comprehensively evaluate the remaining useful life of the battery. That is, $$RUL_t = a \times RUL_c + b \times RUL_r + c \times RUL_\sigma \quad (8)$$
$$\text{s.t. } a + b + c = 1$$

where a, b and c are respectively the weight coefficient of the capacity-based remaining useful life of the battery, the weight coefficient of the internal resistance-based remaining useful life of the battery, and the weight coefficient of the battery stress-based remaining useful life of the battery, and can be selected according to different occasions, $RUL_c$ and $RUL_r$ are respectively the capacity-based remaining useful life of the battery and the internal resistance-based remaining useful life of the battery, and $RUL_\sigma$ is the battery stress-based remaining useful life of the battery.

The decline of battery life is usually considered as the decline of capacity or increase of internal resistance. At present, RUL is mainly defined and evaluated by the changes of the capacity and internal resistance of the battery. The capacity-based definition indicates the number of charging and discharging cycles or usage time when the available capacity of the battery drops to 80% of the rated capacity. That is, $$RUL_c = N_{end}^c - N_{use}^c \text{ or } t_{end}^c - t_{use}^c \quad (9)$$
$$\text{s.t. } 0.8 \le \frac{Q_{use}}{Q_{nor}} \le 1$$

where $$N_{end}^c \text{ and } t_{end}^c$$

are respectively the number of cycles or usage time at the end of life, $$N_{use}^c \text{ and } t_{use}^c$$

are respectively the current number of cycles or usage time, $Q_{use}$ is a current useful capacity of the battery, and $Q_{nor}$ is the rated capacity.

The internal resistance-based definition indicates the number of charging and discharging cycles or usage time when the internal resistance of the battery reaches 1.5 times of the initial internal resistance. That is, $$RUL_r = N_{end}^r - N_{use}^r \text{ or } t_{end}^r - t_{use}^r \quad (10)$$
$$\text{s.t. } 1 \le \frac{R_{use}}{R_{ini}} \le 1.5$$

where $$N_{end}^r \text{ and } t_{end}^r$$

are respectively the number of cycles or usage time at the end of life, $$N_{use}^r \text{ amd } t_{use}^r$$

are respectively the current number of cycles or usage time, $R_{use}$ is a current internal resistance of the battery, and $R_{ini}$ is the initial internal resistance.

Figure 6:
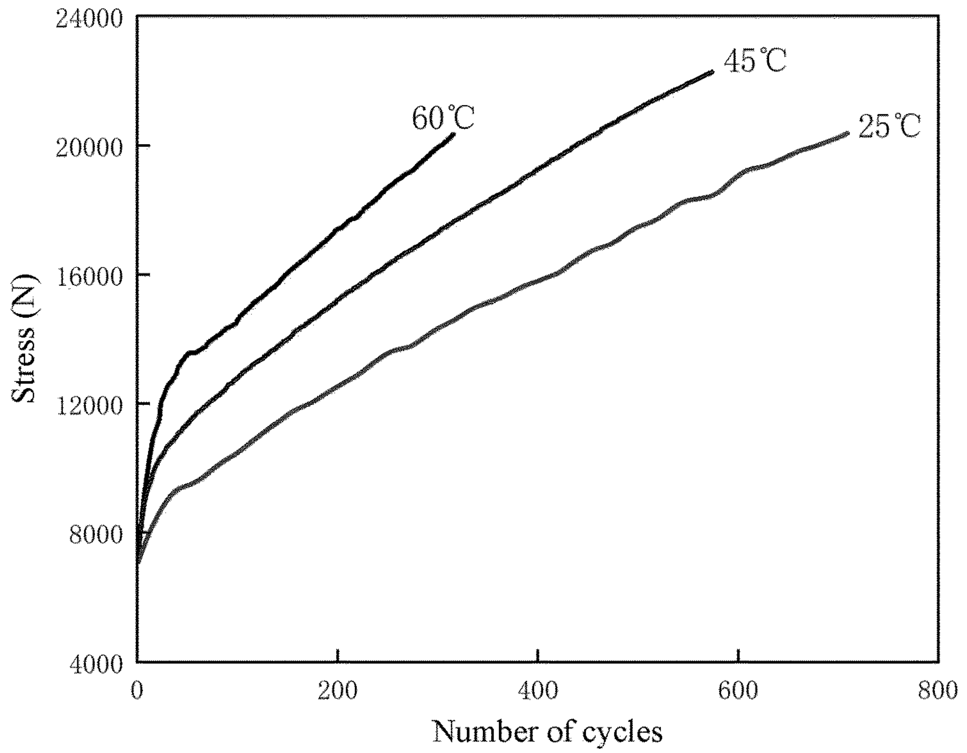
FIG. 6 schematically shows a maximum stress curve in a charging and discharging cycle in Embodiment 1 of the present invention.

A pouch lithium ion battery is subjected to cyclic charging and discharging tests at various temperatures of 25° C., 45° C. and 60° C. respectively, until the useful capacity of the battery declines to 80% of the rated capacity, the internal resistance increases to 1.5 times of the initial internal resistance, and the stress increases to 3 times of the initial stress. The obtained data is preprocessed, and the curves of capacity decline and stress increase are plotted, as shown in FIGS. 5, 6 and 7.

As shown in FIG. 5, the decline of battery capacity and the increase of the number of cycles generally have a linear relation. Moreover, as the temperature rises, the battery life gradually decreases. At 25° C., the battery life is the longest, and about 750 cycles. At 60° C., the battery life decreases to 350 cycles, and is greatly affected by the temperature.

As shown in FIG. 5, with the increase of the number of cycles, the battery stress increases gradually. Similar to the capacity curve, the stress at the end of life at various temperatures is basically the same, which is about 2.9-3.2 times of the initial stress. Therefore, the stress can be used as a feature to define the RUL of battery. Moreover, by analyzing the stress curves at various temperatures, it is known that the inflection point of the stress appears earlier, at about 50-70 cycles. The linearity between the stress and the number of cycle is higher after the inflection point. However, when RUL is traditionally defined based on the capacity or internal resistance, the changes in capacity decline and increase of internal resistance are not obvious in the early stage of the cycling process, that is, the inflection points of the capacity and internal resistance appear later. Therefore, it is more simple and convenient to define, evaluate and predict RUL with stress.

Figure 7:
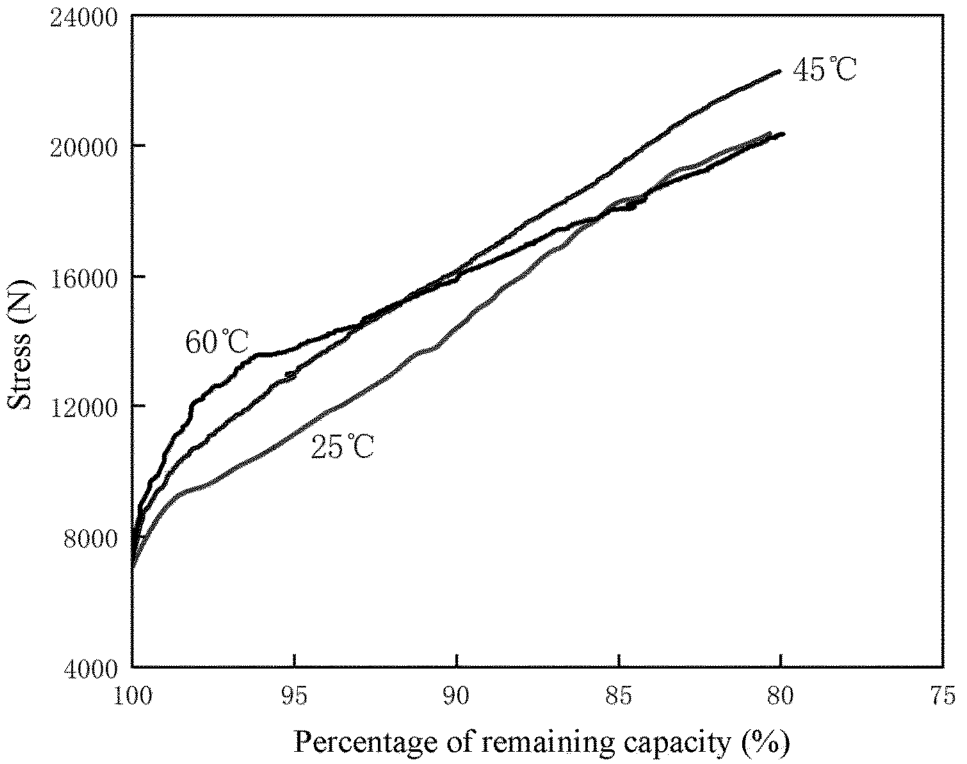
FIG. 7 schematically shows a stress-capacity curve in Embodiment 1 of the present invention.

A stress-capacity relationship curve is plotted with the stress and capacity data, as shown in FIG. 7. It can be seen from FIG. 7 that in the early stage of capacity decline, the stress growth rate of the battery is relatively fast. When the "inflection point" of the stress appears, that is, the capacity drops to about 98%-97% of the rated capacity, the stress growth rate slows down, but it still has a higher linear relationship with the capacity decline, which further shows the superiority of defining RUL based on the stress.

The Pearson correlation coefficient is used to analyze the correlation between the stress and the capacity. The Pearson correlation coefficient r is calculated by Formula (5).

The Pearson coefficients between the capacity and the stress at various temperatures are calculated, and the results are shown in Table 3. Because the decline of battery life is characterized by the increase of stress or the decrease of capacity, the correlation coefficient between the stress and the capacity is negative. It can be seen from Table 3 that there is a good linear relationship between the battery capacity and stress.

TABLE 3

Pearson correlation coefficients between remaining capacity and stress

| Correlation coefficient | Temperature 25° C. | 45° C. | 60° C. |
|---|---|---|---|
| Pearson correlation coefficient | −0.9975 | −0.9978 | −0.9807 |

Based on the above analysis, there is a high correlation between the stress and the battery life. With the increase of number of cycles, the inflection point of the stress appears earlier, and the stress changes linearly with the cycle times before and after the "inflection point". When the current stress of the battery reaches 2.9-3.2 times of the initial stress, the battery life is considered to come to the end. The remaining useful life RUL of the battery is the number of cycles or usage time corresponding to the stress of the battery at the end of the life minus the number of cycles or usage time corresponding to the stress in the current state.

Based on various definitions of RUL by Formula (7), Formula (9) and Formula (10), weights are set for different definitions of RUL, to comprehensively evaluate the remaining useful life of the battery, as shown in Formula (8). In the comprehensive evaluation method, the definitions based on the stress, the capacity, and the internal resistance are combined, an appropriate multi-parameter comprehensive evaluation model is used according to different application scenarios, the weight coefficient is calculated, and the weighted sum of the obtained RULs is calculated, to realize the comprehensive evaluation of the remaining useful life of the battery. The evaluation results are objective and accurate, unlikely to be interfered, and robust. After the evaluation result is obtained, the battery life is predicted by regularized linear regression. The current, voltage, temperature, and stress are used as input features, and the life is used as output feature, then the sample is expressed as $$\begin{bmatrix} f_{1,1} & f_{1,2} & \cdots & f_{1,n} \\ f_{2,1} & f_{2,2} & \cdots & f_{2,n} \\ \cdots & \cdots & & \cdots \\ f_{m,1} & f_{m,2} & \cdots & f_{m,n} \end{bmatrix} \Rightarrow \begin{bmatrix} RUL_{t1} \\ RUL_{t2} \\ \cdots \\ RUL_{tm} \end{bmatrix} \tag{11}$$

where the subscript m is the number of batteries, n is the feature number, t represents the comprehensive evaluation result, and f represents different features.

The linear regression model is $$y'_m = \hat{\omega}^T x_m \tag{12}$$

where $y_m'$ is the predicted life of the battery m, $x_m$ is a P-dimensional feature vector, and ω is a P-dimensional coefficient vector. To avoid over-fitting, a penalty term is added to the equation by applying regularization technique, that is, $$\hat{\omega} = \operatorname{argmin}_{\omega} \|y - X\omega\|_2^2 + \lambda P(\omega) \tag{13}$$

where argmin means to find the value ω that minimizes the error, X is a feature matrix; and by using the common least squares algorithm, the first term can be calculated. P(ω) can be divided into two types according to different regularization techniques. One is the lasso-based technique as shown in Formula (14), and the other is the elastic net technique as shown in Formula (15):

$$P(\omega) = \|\omega\|_1 \tag{14}$$

$$P(\omega) = \frac{1-\alpha}{2}\|\omega\|_2^2 + \alpha\|\omega\|_1 \tag{15}$$

where α is a constant between 0 and 1. When the number of selected features is large, the elastic net technique can achieve a better prediction result. Therefore, different features can be selected according to different scenarios, and then the linear regression network based on lasso or elastic net technique is used, to realize accurate prediction of RUL. When a single stress feature is used for prediction, the predicted life at 25° C., 45° C., and 60° C. is 683, 539 and 315 respectively. The prediction results are evaluated by using absolute error (AE) and relative error (RE), and the calculation formula is:

$$AE = |y_{pre} - y_{act}| \quad (16)$$

$$RE = \frac{|y_{pre} - y_{act}|}{y_{act}} \times 100\% \quad (17)$$

where $y_{pre}$ and $y_{act}$ represents the predicted life and the actual life respectively.

TABLE 4

Comparison of errors

| Error | Temperature | | |
|---|---|---|---|
| | 25° C. | 45° C. | 60° C. |
| Absolute error AE | 26 | 35 | 1 |
| Relative error RE | 3.7% | 6% | 0.3% |

Figure 8:
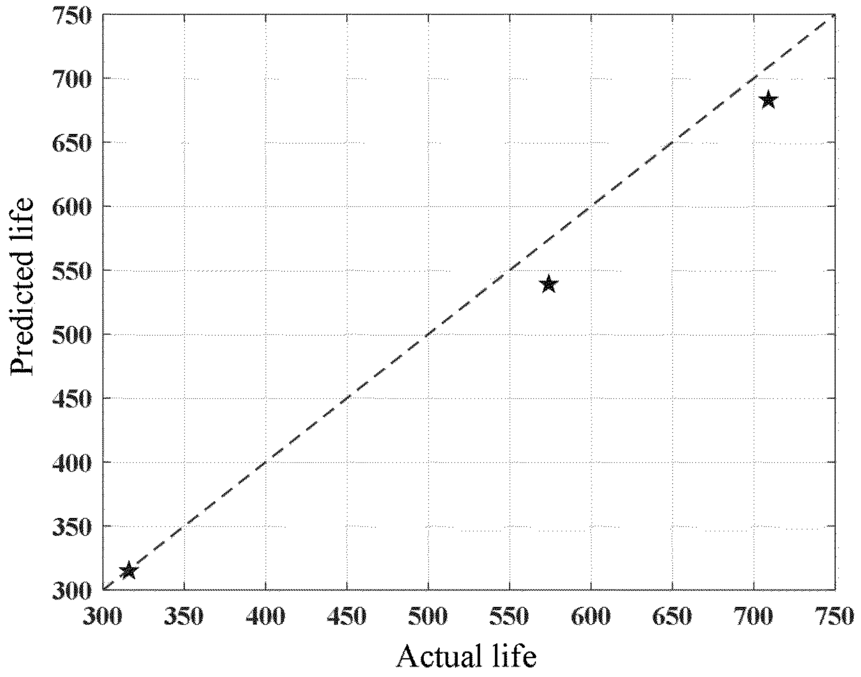
FIG. 8 compares the actual life and the predicted life in Embodiment 1 of the present invention.

Table 4 shows the comparison of errors of prediction. FIG. 8 shows the comparison of actual life and predicted life. As can be seen from FIG. 8 and Table 4, the difference between the predicted life and the actual life is 26 cycles, 35 cycles and 1 cycle respectively, and the error is less than 6%, indicating the superiority of the definition and evaluation of RUL based on stress.

In one or more embodiments, based on the high correlation between the battery stress and capacity, two ways to define the state of health of the battery based on the stress are obtained, which are:

SOH of the battery defined by using the capacity, that is, $SOH_{\sigma1}$:

$$SOH_{\sigma1} = \frac{\frac{1}{\sigma_{now}}}{\frac{1}{\sigma_{new}}} \times 100\% \quad (18)$$

SOH of the battery defined by using the internal resistance, that is, $SOH_{\sigma2}$:

$$SOH_{\sigma2} = \frac{\sigma_{end} - \sigma_{now}}{\sigma_{end} - \sigma_{new}} \times 100\% \quad (19)$$

where $\sigma_{end}$ is the corresponding maximum stress at the end of life of the battery, that is, when the capacity declines to 80% of the initial capacity, $\sigma_{now}$ is the maximum stress of the battery in a current cycle, and $\sigma_{new}$ is the maximum stress of a new battery.

When $SOH_{\sigma1}$ is calculated by Formula (18), only the maximum stress of the initial charging and discharging cycle of a new battery and the current charging and discharging cycle need to be recorded, and the final stress data of the battery does not need to be obtained by aging test. However, the correlation between $SOH_{\sigma1}$ and the battery capacity decreases, and the range is difficult to determine.

The correlation between the $SOH_{\sigma2}$ data and the battery capacity obtained by Formula (19) remains unchanged, and the range is 100% to 0. However, the aging test of the battery is required, to get the maximum stress of the battery at the end of life. SOH of the battery can be obtained accurately and quickly by both definitions, and different calculation methods can be used according to different scenarios.

The formula for comprehensive evaluation of SOH of the battery is:

$$SOH = aSOH_{\sigma} + bSOH_1 + cSOH_2 \quad (20)$$
$$a + b + c = 1$$

where a, b, c are the proportional factors, and appropriate proportional factors can be selected according to different scenarios. For $SOH_{\sigma}$, a different definition formula $SOH_{\sigma1}$ or $SOH_{\sigma2}$ can be used.

$SOH_1$ is calculated by a formula:

$$SOH_1 = \frac{Q_{now}}{Q_{new}} \times 100\% \quad (21)$$

where $Q_{now}$ is the maximum discharging capacity of the battery in the current charging and discharging cycle, and $Q_{new}$ is the rated capacity of the battery.

$SOH_2$ is calculated by a formula:

$$SOH_2 = \frac{R_{end} - R_{now}}{R_{end} - R_{new}} \times 100\% \quad (22)$$

where $R_{end}$ is the internal resistance at the end of life of the battery, $R_{now}$ is a current internal resistance of the battery, and $R_{new}$ is the internal resistance of a new battery.

In the comprehensive evaluation method, the definitions based on the stress, the capacity, and the internal resistance are combined, an appropriate multi-parameter evaluation model is used according to the scenario, the proportional factors are calculated, and the weighted sum of the obtained SOHs is calculated, to realize the comprehensive evaluation of the state of health of the battery. The evaluation results are objective and accurate, unlikely to be interfered, and robust.

As shown in FIGS. 5 and 6, with the increasing number of charging and discharging cycles, the battery capacity gradually declines, the battery stress increases constantly, and the high temperature accelerates the capacity decline rate and the stress growth rate. With the stress and maximum capacity data, a stress-capacity curve as shown in FIG. 7 is plotted. it is further intuitively found that the decline of the battery capacity has a high correlation with the increase of the stress.

The linear relationship between the stress and the capacity is specifically calculated by Formula (5) using Pearson correlation coefficient, and the Pearson coefficients between the remaining useful capacity and the maximum stress at various temperatures are shown in Table 3. Because the decline of state of health of the battery is characterized by the increase of stress and the decrease of capacity, the correlation coefficient between the stress and the capacity is negative, that is, the battery capacity and the stress have a good linear relationship.

Figure 9:
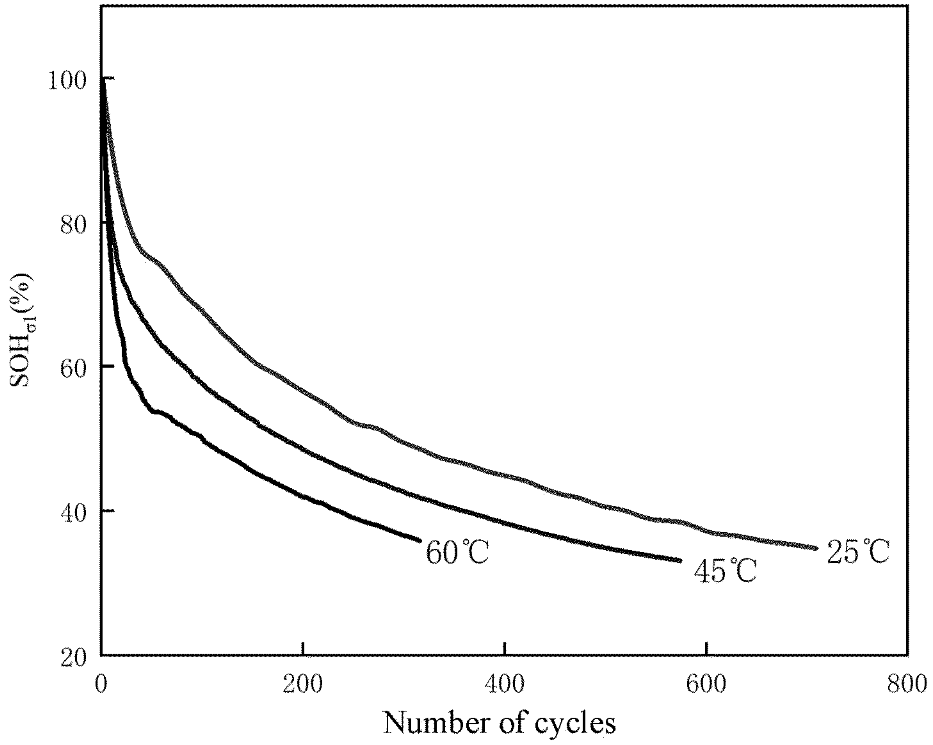
FIG. 9 schematically shows a change curve of $SOH_{\sigma 1}$ in Embodiment 1 of the present invention.
Figure 10:
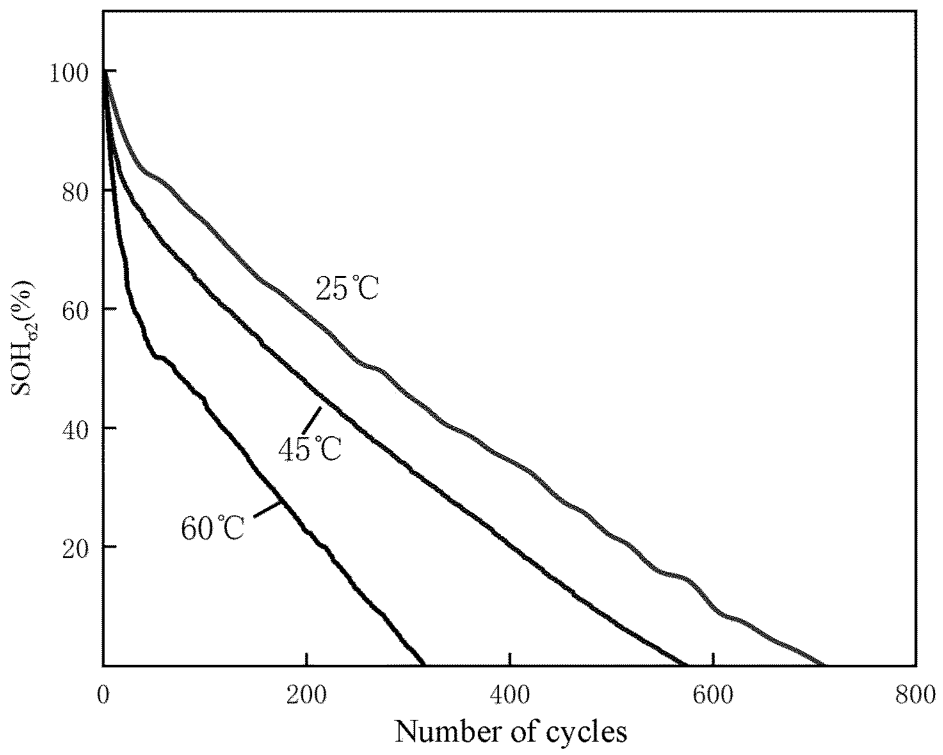
FIG. 10 schematically shows a change curve of $SOH_{\sigma 2}$ in Embodiment 1 of the present invention.

According to the correlation coefficient obtained in Table 3, it is known that the stress is inversely proportional to the capacity. According to the capacity-based definition and the internal resistance-based definition for the state of health of the battery, Formulas (18) and (19) can be deduced. Change curves of $SOH_{\sigma1}$ and $SOH_{\sigma2}$ are plotted, as shown in FIGS. 9 and 10.

The Pearson correlation coefficients between $SOH_{\sigma1}$ and $SOH_{\sigma2}$ and the battery capacity are calculated in combination with Formula (5). The results are shown in Table 5. Both definitions have a high correlation with the battery capacity and can be used to evaluate the state of health of the battery.

TABLE 5

Pearson correlation coefficients between $SOH_{\sigma 1}$ and $SOH_{\sigma 2}$ and capacity

| Correlation coefficient | Temperature 25° C. | 45° C. | 60° C. |
|---|---|---|---|
| $SOH_{\sigma 1}$ | 0.9620 | 0.9483 | 0.8852 |
| $SOH_{\sigma 2}$ | 0.9975 | 0.9978 | 0.9807 |

When $SOH_{\sigma 1}$ is calculated by Formula (18), only the maximum stress of the initial charging and discharging cycle of a new battery and the current charging and discharging cycle need to be recorded, and the final stress data of the battery does not need to be obtained by aging test. From FIG. 9 and Table 5, it can be seen that the data of $SOH_{\sigma 1}$ is sensitive to data changes in the first 50-60 cycles, but declines slowly in the later cycles, is weakly sensitive to the change of number of cycles, and lowly correlated with the battery capacity. At the end of life of the battery, the specific range of $SOH_{\sigma 1}$ is uncertain.

From FIG. 10 and Table 5, it can be seen that the data of $SOH_{\sigma 2}$ obtained by Formula (19) has the same change trend with the stress data, and is highly correlated with the battery capacity, which is basically linear with the number of cycles, and can more accurately characterize the state of health of the battery. When the value of $SOH_{\sigma 2}$ in the initial use of battery is 100%, the battery stress increases continuously with the aging of battery performance, $SOH_{\sigma 2}$ gradually decreases until it drops to 0, and the range is easy to determine. However, the aging test of the battery is required, to get the maximum stress of the battery at the end of life. Different calculation methods can be used according to different scenarios.

The determination of the battery stress in the present invention is simple, convenient and rapid, and can accurately reflect the state of health of the battery. By combining various SOHs defined based on the stress, internal resistance, and the capacity, and using a variety of comprehensive evaluation models, the weights are calculated and adjusted according to the needs in different scenarios, so that the evaluation results are objective and accurate, unlikely to be interfered, and robust. In the comprehensive evaluation method, the definitions based on the stress, the capacity, and the internal resistance are combined, an appropriate multi-parameter evaluation model is used according to the scenario, the proportional factors are calculated, and the weighted sum of the obtained SOHs is calculated, to realize the comprehensive evaluation of the state of health of the battery.

According to the present invention, the battery life evaluation and prediction are comprehensively considered in the process of calculating the current state of health of the battery, to improve the accuracy of comprehensive evaluation for the state of health of the battery.

In the present invention, based on the high correlation between the battery stress and the SOC of the battery, the state of charge of the battery is redefined based on the stress $SOC_{\sigma}$, so as to realize the accurate estimation of the SOC of the battery. According to the high correlation between the battery stress and the SOC, the state of charge of the battery can be reflected accurately in real time. Therefore, the SOC of the battery can be accurately and efficiently evaluated in various SOHs. The evaluation results are unlikely to be interfered, and robust.

Embodiment 2

Embodiment 2 of the present invention describes a stress-based comprehensive method for evaluating state of health of a power battery.

Figure 11:
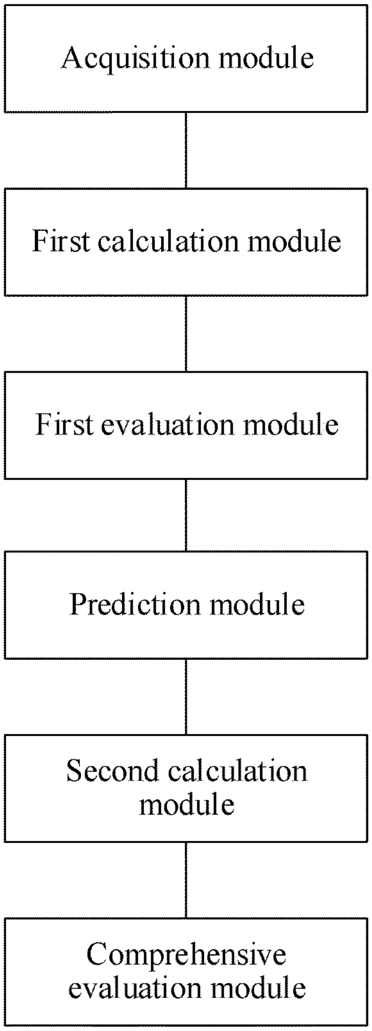
FIG. 11 shows a structural block diagram of a stress-based evaluation system for state of health of power battery in Embodiment 2 of the present invention.

As shown in FIG. 11, the stress-based comprehensive system for evaluating state of health of a power battery includes:

- an acquisition module, configured to acquire the stress and capacity of a charging and discharging cycle of the battery;
- a first calculation module, configured to, according to the correlation between the acquired stress and capacity, calculate the state of charge of the battery and the state of health of the battery defined based on the stress;
- a first evaluation module, configured to evaluate the state of charge of the battery by taking the correlation between the stress and the state of charge of the battery into account;
- a prediction module, configured to acquire a current capacity and internal resistance of the battery and predict a current remaining useful life of the battery;
- a second calculation module, configured to, according to the acquired current remaining useful life of the battery, calculate a current capacity-based state of health of the battery and internal resistance-based state of health of the battery respectively; and
- a comprehensive evaluation module, configured to calculate a weighted sum of the obtained state of health of the battery defined based on the stress, the capacity-based state of health of the battery and the internal resistance-based state of health of the battery, to obtain a comprehensively evaluated state of health of the battery.

The detailed steps are the same as those of the stress-based comprehensive method for evaluating state of health of a power battery provided in Embodiment 1, and will not be repeated here.

Embodiment 3

Embodiment 3 of the present invention provides a non-transitory computer readable storage medium.

A non-transitory computer-readable storage medium, storing a program thereon, is provided. The program, when executed by a processor, implements the steps of the stress-based comprehensive method for evaluating state of health of a power battery according to Embodiment 1 of the present invention.

The detailed steps are the same as those of the stress-based comprehensive method for evaluating state of health of a power battery provided in Embodiment 1, and will not be repeated here.

Embodiment 4

Embodiment 4 of the present invention provides an electronic device.

An electronic device includes a memory, a processor, and a program stored in the memory and executable on the processor. The program, when executed by the processor, implements the steps of the stress-based comprehensive method for evaluating state of health of a power battery according to Embodiment 1 of the present invention.

The detailed steps are the same as those of the stress-based comprehensive method for evaluating state of health of a power battery provided in Embodiment 1, and will not be repeated here.

Preferred embodiments of the present invention have been described above; however, the present invention is not limited thereto. Various variations and changes can be made by those skilled in the art to the specific implementations. Any modification, equivalent substitution, improvement, and improvement made without departing from the spirit and principle of the present invention are contemplated in the scope of protection of the present invention.

What is claimed is:

1. A stress-based comprehensive method for evaluating state of health of a power battery, comprising:

acquiring a stress and a capacity of a charging and discharging cycle of a battery;

according to a correlation between the acquired stress and capacity, calculating a state of charge of the battery and a state of health of the battery defined based on the stress;

evaluating the state of charge of the battery by taking the correlation between the stress and the state of charge of the battery into account;

acquiring a current capacity and an internal resistance of the battery and predicting a current remaining useful life of the battery;

according to the acquired current remaining useful life of the battery, calculating a current capacity-based state of health of the battery and an internal resistance-based state of health of the battery respectively; and calculating a weighted sum of the obtained state of health of the battery defined based on the stress, the capacity-based state of health of the battery and the internal resistance-based state of health of the battery, and obtaining a comprehensively evaluated state of health of the battery by combining the weighted sum with the evaluated state of charge of the battery.

2. The stress-based comprehensive method for evaluating state of health of a power battery according to claim 1, wherein a new battery is sampled to acquire a maximum stress, the internal resistance and a discharging capacity of an initial charging and discharging cycle, and the maximum stress and the internal resistance of a corresponding charging and discharging cycle at the end of life of the battery; after acquiring the stress and the capacity of the charging and discharging cycles of the battery, the battery is subjected to a cyclic charging and discharging test to obtain the battery capacity and the maximum stress data of each cycle, and the obtained data is preprocessed.

3. The stress-based comprehensive method for evaluating state of health of a power battery according to claim 1, wherein the state of charge of the battery represents a current remaining charge in the battery, that is, the ratio of a remaining quantity of electricity to a rated capacity of the battery at a discharging rate; considering a linear relationship between the stress and capacity change of the battery in a single charging and discharging cycle, the battery is subjected to a cyclic charging and discharging test and the stress and state-of-charge data of the battery in the single charging and discharging cycle under different state-of-health conditions is recorded respectively, to obtain the stress and state of charge of the battery in the single charging and discharging cycle in different states of health.

4. The stress-based comprehensive method for evaluating state of health of a power battery according to claim 1, wherein considering the correlation between the stress and the state of charge of the battery, the state of charge $SOC_\sigma$ of the battery defined based on the stress is:

$$SOC_\sigma = \frac{\sigma_C - \sigma_1(SOH_\sigma)}{\sigma_2(SOH_\sigma) - \sigma_1(SOH_\sigma)} \times 100\%$$

where $\sigma(SOH_\sigma)$ is the battery stress as a function of the state of health, that is, at a $SOH_\sigma$, the battery stress of a state-of-charge is determined; $\sigma_1(SOH_\sigma)$ and $\sigma_2(SOH_\sigma)$ are respectively the corresponding stress of the battery when fully discharged and fully charged at the current $SOH_\sigma$; and $\sigma_C$ is the current stress determined during use.

5. The stress-based comprehensive method for evaluating state of health of a power battery according to claim 1, wherein a specific process for evaluating the state of charge of the battery comprises:

obtaining the stress and the state of charge of the battery in a single charging and discharging cycle under different state-of-health conditions;

analyzing the correlation between the stress and the state of charge of the battery in different health states, to obtain a linear relationship between the state of charge and the stress; and according to the obtained linear relationship, evaluating the state of charge of the battery defined based on the stress.

6. The stress-based comprehensive method for evaluating state of health of a power battery according to claim 5, wherein the battery stress is inversely proportional to the state of health of the battery.

7. The stress-based comprehensive method for evaluating state of health of a power battery according to claim 5, wherein the linear relationship between the state of charge and the stress is obtained by calculating a Pearson correlation coefficient between the stress and the state of charge.

8. The stress-based comprehensive method for evaluating state of health of a power battery according to claim 1, wherein a specific process for predicting the current remaining useful life of the battery comprises:

evaluating the remaining useful life of the battery by taking the battery capacity, the internal resistance and the battery stress comprehensively into account, comprehensively through a specific process comprising:

when a useful capacity of the battery is lower than an initially set value of the capacity, the internal resistance is increased to k times of an initial internal resistance, and the stress is increased to m times of an initial stress, stopping a cyclic charging and discharging test, and recording the battery stress at this time, where k and m are positive numbers;

analyzing the stress data, and calculating the correlation between the battery stress and the battery life, to obtain the remaining useful life of the battery defined based on the stress;

calculating the corresponding remaining useful life of the battery based on the capacity and the internal resistance respectively, and comprehensively evaluating the remaining useful life of the battery by combining the capacity-based remaining useful life of the battery and the internal resistance-based remaining useful life of the battery with the remaining useful life of the battery defined based on the stress.

9. The stress-based comprehensive method for evaluating state of health of a power battery according to claim 8, wherein the remaining useful life of the battery $RUL_\sigma$ defined based on the stress is $$RUL_\sigma = N_{end}^\sigma - N_{use}^\sigma \text{ or } t_{end}^\sigma - t_{use}^\sigma$$
$$\text{s.t. } 1 \le \frac{\sigma_{use}}{\sigma_{ini}} \le M,$$

where $$N_{use}^\sigma,\ t_{use}^\sigma$$

are respectively a number of cycles or usage time at the end of life, $$N_{use}^\sigma,\ t_{use}^\sigma$$

are respectively a current number of cycles or usage time, $\sigma_{use}$ is a current battery stress, $\sigma_{ini}$ is an initial stress, and M is a constant.

10. The stress-based comprehensive method for evaluating state of health of a power battery according to claim 8, wherein by taking the battery capacity, the internal resistance and the battery stress comprehensively into account, the evaluated remaining useful life of the battery $RUL_t$ is $$RUL_t = a \times RUL_c + b \times RUL_r + c \times RUL_\sigma$$
$$\text{s.t. } a + b + c = 1,$$

where a, b and c are respectively the weight coefficient of the capacity-based remaining useful life of the battery, the weight coefficient of the internal resistance-based remaining useful life of the battery, and the weight coefficient of the battery stress-based remaining useful life of the battery, and can be selected according to different occasions, $RUL_c$ and $RUL_r$ are respectively the capacity-based remaining useful life of the battery and the internal resistance-based remaining useful life of the battery, and $RUL_\sigma$ is the battery stress-based remaining useful life of the battery.

11. The stress-based comprehensive method for evaluating state of health of a power battery according to claim 1, wherein the state of health of the battery is calculated according to the capacity, to obtain the state of health $SOH_{\sigma 1}$ of the battery defined based on the stress, that is, $$SOH_{\sigma 1} = \frac{\frac{1}{\sigma_{now}}}{\frac{1}{\sigma_{new}}} \times 100\%,$$

where $\sigma_{now}$ is a maximum stress of the battery in a current cycle, and $\sigma_{new}$ is a maximum stress of a new battery.

12. The stress-based comprehensive method for evaluating state of health of a power battery according to claim 1, wherein the state of health of the battery is calculated according to the internal resistance, to obtain the state of health $SOH_{\sigma 2}$ of the battery defined based on the stress, that is, $$SOH_{\sigma 2} = \frac{\sigma_{end} - \sigma_{now}}{\sigma_{end} - \sigma_{new}} \times 100\%,$$

where $\sigma_{end}$ is a corresponding maximum stress at the end of life of the battery, that is, when the capacity declines to 80% of the initial capacity, $\sigma_{now}$ is a maximum stress of the battery in a current cycle, and $\sigma_{new}$ is a maximum stress of a new battery.

13. The stress-based comprehensive method for evaluating state of health of a power battery according to claim 1, wherein a Pearson correlation coefficient between the acquired stress and capacity is calculated to analyze the correlation between the obtained stress and capacity.

14. The stress-based comprehensive method for evaluating state of health of a power battery according to claim 1, wherein the states of health of the battery considering different factors and their proportional factors are calculated, and the weighted sum of the obtained different states of health of the battery is calculated according to their proportional factors, to realize the comprehensive evaluation of the state of health of the battery.

15. A non-transitory computer-readable storage medium, storing a computer program, wherein the program, when executed by a processor, implements the steps of the stress-based comprehensive method for evaluating the state of health of a power battery according to claim 1.

16. An electronic device, comprising a memory, a processor, and a computer program stored in the memory and executable on the processor, wherein the program, when executed by the processor, implements the steps of the stress-based comprehensive method for evaluating the state of health of a power battery according to claim 1.

* * * * *